(12) United States Patent
Koo

(10) Patent No.: US 6,977,864 B2
(45) Date of Patent: Dec. 20, 2005

(54) SYNCHRONOUS DYNAMIC RANDOM ACCESS MEMORY DEVICE WITH SINGLE DATA RATE/DOUBLE DATA RATE MODE

(75) Inventor: Kie-Bong Koo, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 28 days.

(21) Appl. No.: 10/748,557

(22) Filed: Dec. 29, 2003

(65) Prior Publication Data

US 2004/0240275 A1   Dec. 2, 2004

(30) Foreign Application Priority Data

May 31, 2003   (KR) .................... 10-2003-0035132

(51) Int. Cl.[7] ................................................ G11C 8/00
(52) U.S. Cl. ................ 365/233; 365/189.11; 365/193; 365/189.05
(58) Field of Search ..................... 365/233, 189.11, 365/193, 189.05

(56) References Cited

U.S. PATENT DOCUMENTS 6,424,585 B1 *  7/2002  Ooishi ........................ 365/226
6,426,900 B1 *  7/2002  Maruyama et al. ......... 365/194
6,496,403 B2   12/2002  Noda et al.
2004/0100837 A1 *  5/2004  Lee

FOREIGN PATENT DOCUMENTS

| KR | 1999-0066271 | 8/1999 |
|---|---|---|
| KR | 10 278653 B1 | 10/2000 |

* cited by examiner

Primary Examiner—Tuan T. Nguyen
(74) Attorney, Agent, or Firm—Blakely, Sokoloff, Taylor & Zafman

(57) ABSTRACT

A data output driver of a combination type of a synchronous dynamic random access memory (SDRAM) device operated in both of a single data rate (SDR) mode and a double data rate (DDR) mode, the data output driver includes a first input/output line connected between a drain of a pull-up transistor and a data input/output pad, a second input/output line connected between a drain of a pull-down transistor and the data input/output pad, at least one switching unit formed on each of the first input/output line and the second input/output line, and at least one resistor parallel-connected with the switch and formed on each of the first input/output line and the second input/output line, wherein the switching unit is turned on or turned off by selecting one of a SDR mode and a DDR mode.

23 Claims, 7 Drawing Sheets

SYNCHRONOUS DYNAMIC RANDOM ACCESS MEMORY DEVICE WITH SINGLE DATA RATE/DOUBLE DATA RATE MODE

FIELD OF THE INVENTION

The present invention relates to a synchronous dynamic random access memory (SDRAM); and, more particularly, a combination type of a synchronous dynamic random access memory (SDRAM) device capable of easily selecting one of a single data rate (SDR) mode and a double data rate (DDR) mode through an option-selection process carried out during SDRAM fabrication.

DESCRIPTION OF RELATED ARTS

Usually, an amount of current used in an input/output (IO) is standardized for an impedance match of an IO interface of a memory device. The standardization of the current amount is called an input/output buffer information specification (IBIS). For a product having a high speed operation, the IBIS should be more thoroughly controlled to reduce a noise. Also, a difference between a maximum current amount and a minimum current amount standardized according to the IBIS should be minimized.

FIG. 1 is a diagram showing a conventional data output driver.

As shown, each of a pull-up driver block 110 and a pull-down driver block 120 is commonly connected to a data pad (DQ PAD) 130 through an IO line, and data corresponding to a group of supply voltages VDDQ generated by a first to a third pull-up control signals UP1B, UP2B and UP3B and another group of supply voltages VSSQ generated by a first to a third pull-down control signals DN1, DN2 and DN3 are outputted through the IO line.

The pull-up driver block 110 constituted with a first to a third pull-up drivers 111, 112 and 113 are operated by the first to the third pull-up control signals UP1B, UP2B and UP3B, respectively. Herein, the pull-up driver block 110 may be constituted with more or less than three pull-up drivers. The pull-up driver block 110 is operated in two modes. One is a full strength mode. Herein, all of the first to the third pull-up control signals UP1B, UP2B and UP3B are activated and enabled in the full strength mode, and therefore allowing a maximum pull-up current to flow. For the sake of convenience, each of the pull-up drivers 111, 112 and 113 is represented with one P-channel metal oxide semiconductor (PMOS) transistor. However, each of the pull-up drivers is constituted with a plurality of PMOS transistors in reality. In addition, the first pull-up driver 111 and the second pull-up driver 112 can be constituted with the same or different number of the PMOS transistors.

The pull-down driver block 120 also has the same circuit configuration as the pull-up driver block 110 does.

In a combination type of a synchronous dynamic random access memory (SDRAM) device, all data output drivers used in a single data rate (SDR) mode and a double data rate (DDR) mode have the same circuit configuration as shown in FIG. 1. However, different output currents are required for the SDR mode and the DDR mode. Accordingly, the IBIS used in the SDR mode should be different from that used in the DDR mode. In spite of the above, system users want to employ the IBIS satisfying both of the SDR and DDR modes through the use of the data output driver having the identical circuit configuration and size. However, as shown in FIG. 2, it is not easy to satisfy the IBIS standards for both of the SDR and DDR modes. Among the IBIS standards, it is difficult to standardize especially an output low current (IOL) satisfied for both of the SDR and DDR modes.

In short, as shown from an IOL simulation of the DDR SDRAM device in FIG. 2, a real current value (Fast) exceeds a maximum limit current value (Max) of the IBIS when the DDR SDRAM is operated at a maximum velocity in a linear region. That is, in case that any data output driver shown in FIG. 1 is used for the combination type of the SDRAM device, the IBIS cannot be satisfied for both all of the SDR and DDR modes. Furthermore, even though the operativeness of the pull-up and pull-down drivers are decided by the first to the third pull-up control signals UP1B, UP2B and UP3B and the first to the third pull-down control signals DN1, DN2 and DN3, it is impossible to obtain a required IOL property of the DDR SDRAM device in the above mentioned linear region without improving a transistor property. Also, it is impossible to eliminate the aforementioned drawback solely by improving the transistor property.

In addition, the DDR SDRAM device includes a data strobe (DQS) output driver, wherein a circuit configuration of the data strobe (DQS) output driver is practically identical to that of the data output driver.

However, the SDR SDRAM device does not need to use the data output driver because the SDR SDRAM device does not require a data strobe signal. Accordingly, for the combination type of the SDRAM device, a data strobe pad (DQS PAD) used only in the DDR SDRAM device should be designed not to bring about a malfunction of the SDRAM device caused by a floating state of the DOS PAD when in the SDR mode.

SUMMARY OF THE INVENTION

It is, therefore, an object of the present invention to provide a combination type of a synchronous dynamic random access memory (SDRAM) device capable of satisfying an input/output buffer information specification for both of a single data rate (SDR) mode and a double data rate (DDR) mode through an option-selection process carried out during SDRAM fabrication.

In accordance with an aspect of the present invention, there is provided a data output driver of a combination type of a synchronous dynamic random access memory (SDRAM) device operated in both of a single data rate (SDR) mode and a double data rate (DDR) mode, the data output driver including: a first input/output line connected between a drain of a pull-up transistor and a data input/output pad; a second input/output line connected between a drain of a pull-down transistor and the data input/output pad; at least one switching unit formed on each of the first input/output line and the second input/output line; and at least one resistor parallel-connected with the switch and formed on each of the first input/output line and the second input/output line, wherein the switching unit is turned on or turned off by selecting one of a SDR mode and a DDR mode.

In accordance with another aspect of the present invention, there is provided data strobe output driver of a combination type of a synchronous dynamic random access memory (SDRAM) device operated in both of a single data rate (SDR) mode and a double data rate (DDR) mode, the data strobe output driver including: a first input/output line connected between a drain of a pull-up transistor and a data strobe input/output pad; a second input/output line connected between a drain of a pull-down transistor and the data strobe input/output pad; a first switch formed on each of the first input/output line and the second input/output line; a resistor parallel-connected with the first switch and formed on each of the first input/output line and the second input/output line; a second switch formed on the first input/output line and the second input/output line between the data strobe output pad and an output terminal of the first switch; and a third switch formed between an output of the second switch and a ground voltage, wherein the first to the third switches are turned on or turned off by selecting one of the SDR mode and the DDR mode.

In accordance with further another aspect of the present invention, there is provided a synchronous dynamic random access memory (SDRAM) of a combination type applying a singe data rate (SDR) mode and a double data rate (DDR) mode having a data output driver, a data strobe output driver and a data mask driver, each the data output driver, the data strobe output driver and the data mask driver including: a first input/output line connected with a drain of a pull-up transistor and an input/output pad; a second input/output line connected with a drain of a pull-down transistor and the input/output pad; a first switching unit connected with each of the first input/output line and the second input/output line at the drains of the pull-up transistor and the pull-down transistor; a first resistor parallel-connected with the first switch formed on each of the first input/output line and the second input/output line; a second switch formed on each of the first input/output line and the second input/output line adjacent to the input/output pad; a second resistor parallel-connected with the second switch and formed on each of the first input/output line and the second input/output line; and a third switch formed on each of the first input/output line and the second input/output line allocated between the first switch and the second switch, wherein the first to the third switches are turned on or off by selecting one of the SDR mode and the DDR mode.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, detailed descriptions on variously applicable preferred embodiments of the present invention will be provided with reference to the accompanying drawings.

Figure 3:
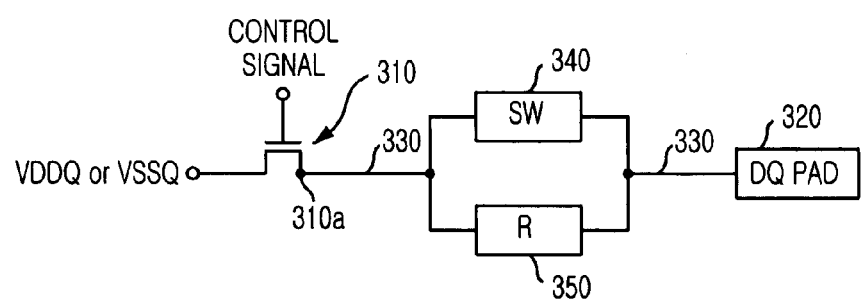
FIG. 3 is a block diagram showing a circuit configuration of a data output driver having a combination type of a SDRAM device in accordance with a first preferred embodiment of the present invention.

FIG. 3 is a block diagram showing a circuit configuration of a data output driver of a combination type of a SDRAM device in accordance with a first embodiment of the present invention. For convenience, only one transistor representing both of a pull-up driver and a pull-down driver is illustrated in the FIG. 3. Hereinafter, this transistor is referred to as a pull-up and pull-down transistor 310.

Figure 1:
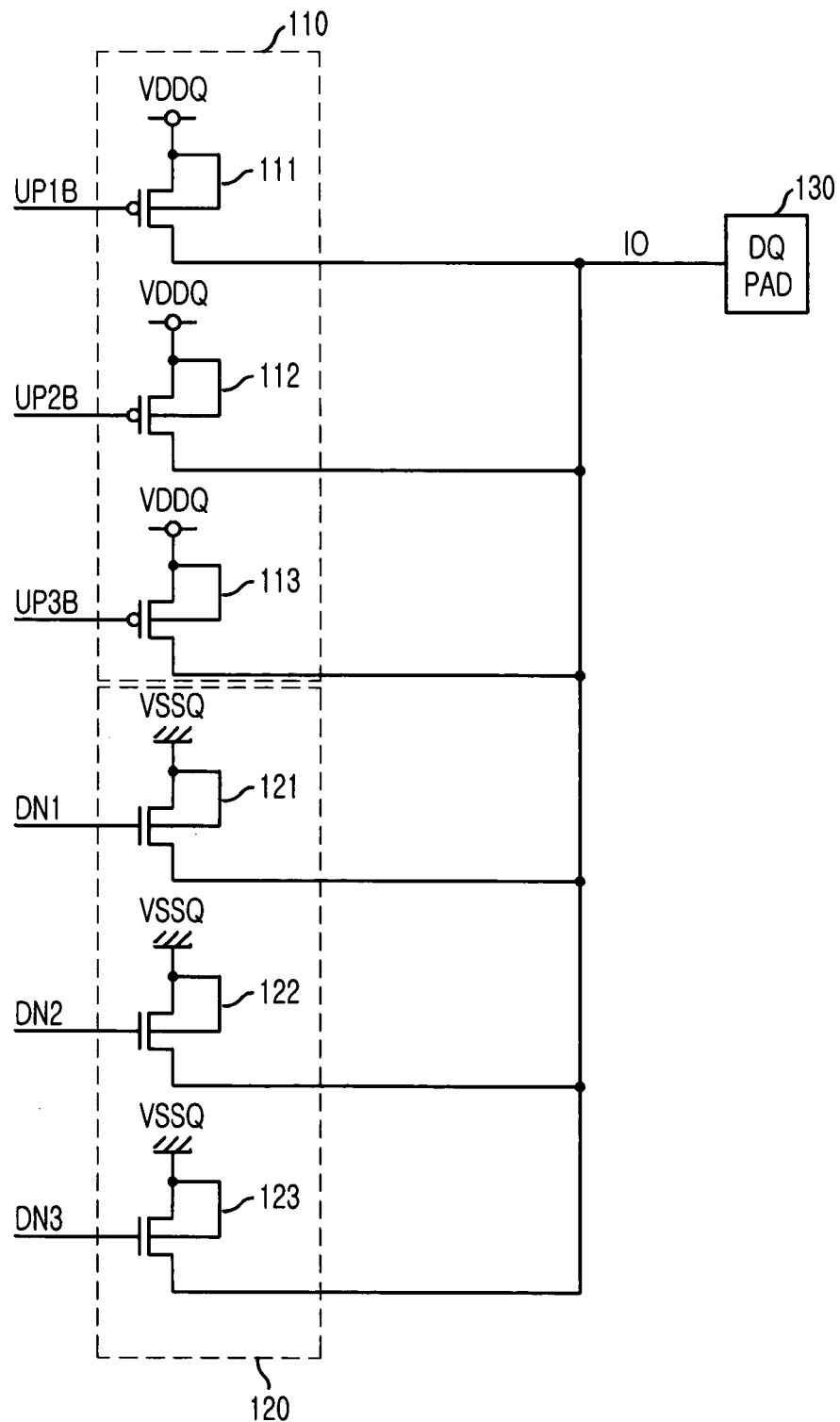
FIG. 1 is a diagram showing a circuit configuration of a conventional data output driver.
Figure 2:
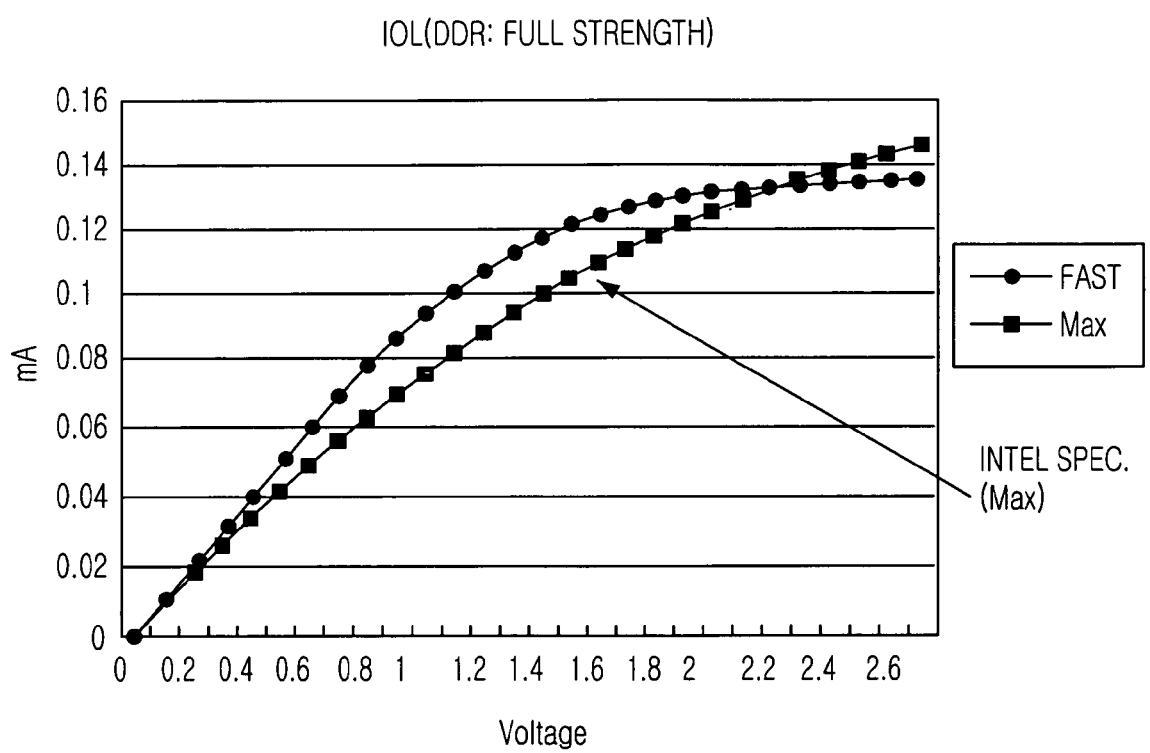
FIG. 2 is a graph showing a simulation result for a current/voltage property in a double data rate (DDR) mode of a conventional data output driver having a combination type of a synchronous dynamic random access memory (SDRAM) device.

As shown, both ends of an input/output line 330 are connected with a drain terminal 310A of the pull-up and pull-down transistor 310 and a data input/output pad (DQ PAD) 320, respectively. In addition, a switch 340 and a resistor 350 which are parallel-connected to each other are connected with the input/output line 330. The switch 340 is turned on or turned off by a selection of a single data rate (SDR) mode or a double data rate (DDR) mode. When the DDR mode is selected, the switch 340 connected between the pull-up and pull-down transistor 310 and the data input/output pad 320 is turned off, and a pull-down current flows into the data input/output pad 320 through the resistor 350. Accordingly, an output low current (IOL) property in a linear area of the DDR mode can be adequately controlled to satisfy an input/output buffer information specification (IBIS) standard. In short, an IOL value in the linear area shown in FIG. 2 can be controlled not to deviate from a maximum value that a system user wants to obtain.

Figure 4:
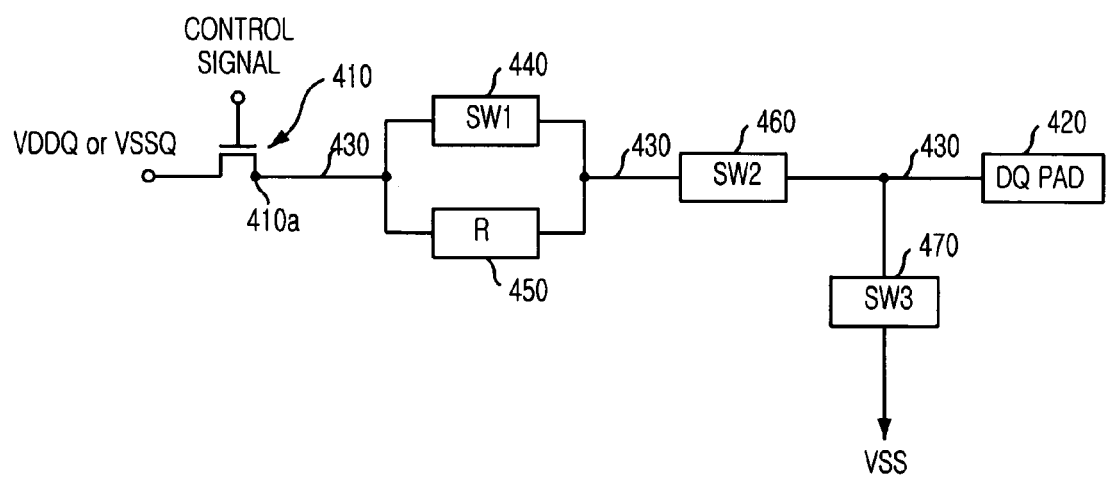
FIG. 4 is a block diagram showing a circuit configuration of a data strobe output driver of the combination type of the SDRAM device in accordance with the first embodiment of the present invention.

FIG. 4 is a block diagram showing a data strobe (DQS) output driver of the combination type of the SDRAM device in accordance with the first embodiment of the present invention. For convenience, only one transistor representing both of a pull-up driver and a pull-down driver is illustrated in the FIG. 4. Hereinafter, this transistor is referred to as a pull-up and pull-down transistor 410.

As shown, both ends of an input/output line 430 are connected with a drain terminal 410A of the pull-up and pull-down transistor 410 and a data strobe input/output pad 420, respectively. In addition, a first switch (SW1) 440 and a resistor (R) 450 which are parallel-connected to each other are connected with the input/output line 430. A second switch (SW2) 460 is connected between the data strobe input/output pad 420 and a block area where the first switch 440 and the resistor 450 are parallel-connected to each other. Also, a third switch 470 is formed between the input/output line 430, connected between the second switch 460 and the data strobe input/output pad 420, and a ground voltage (VSS).

The first, second and third switches 440, 460 and 470 are selectively turned on or turned off by responding to a selection of the SDR mode or the DDR mode.

When the DDR mode is selected, the first switch 440 and the third switch 470 are turned off, while the second switch 460 is turned on. On the other hand, when the SDR mode is selected, the first switch 440 is turned off, while the second switch 460 and the third switch 470 are turned on.

Accordingly, in the DDR mode, a pull-up and pull-down current flows to the data strobe input/output pad 420 via the resistor 450. At this time, the pull-up and pull-down current that flows through the resistor 450 can be adequately adjusted to satisfy a standard output low current (IOL) that the system user intends to obtain. Also, in the SDR mode, the data strobe input/output pad 420 is connected with the data ground voltage VSS under a state of the turned-off second switch 460, whereby it is possible to prevent a malfunction of the SDRAM device caused by a floating state of the data strobe input/output pad 420 when in the SDR mode.

Figure 5:
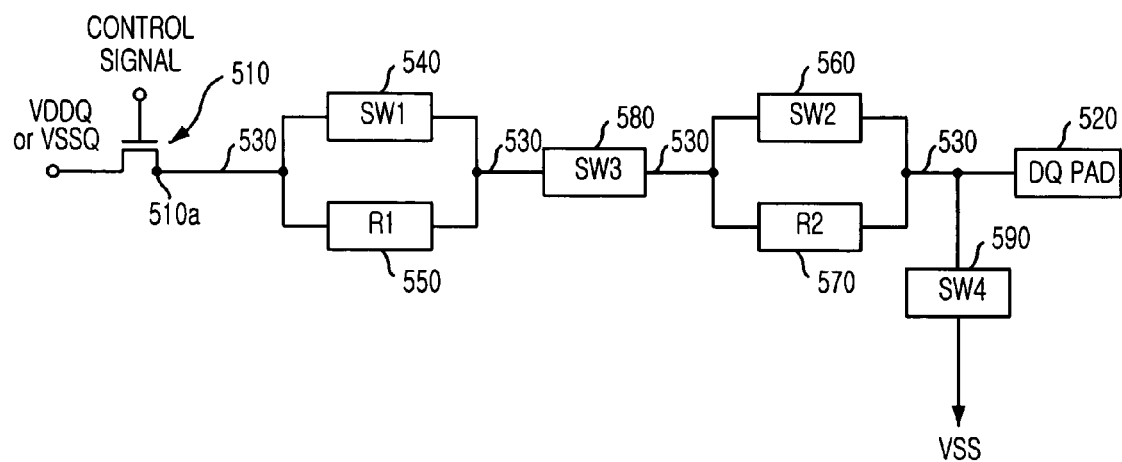
FIG. 5 is a block diagram showing a circuit configuration of a data output driver having a combination type of a SDRAM device in accordance with a second preferred embodiment of the present invention.

FIG. 5 is a block diagram showing a data output driver of a combination type of a SDRAM device in accordance with a second embodiment of the present invention. For the sake of convenience, only one transistor representing both of a pull-up driver and a pull-down driver is illustrated in the FIG. 5. Hereinafter, this transistor is referred to as a pull-up and pull-down transistor 510.

As shown, both ends of an input/output line 530 are connected with a drain terminal 510A of a pull-up and pull-down transistor 510 and a data input/output pad 520, respectively. In addition, a first switch (SW1) 540 and a first resistor (R1) 550 which are parallel-connected to each other are connected with the input/output line 530, and a second switch (SW2) 560 and a second resistor (R2) 570 which are parallel-connected to each other are connected with the input/output line 530 as well. A third switch 580 is formed between a first block area where the first switch 540 and the first resistor 550 are parallel-connected to each other and a second block area where the second switch 560 and the second resistor 570 are parallel-connected to each other. Also, a fourth switch 590 is formed between the input/output line 530 connected between the above-mentioned second block area and the data input/output pad 520 and a ground voltage VSS.

The first switch 540, the second switch 560, the third switch 580 and the fourth switch 590 are selectively turned on or turned off by a selection of the SDR mode or the DDR mode.

When the DDR mode is selected, the first switch 540, the second switch 560 and the fourth switch 590 are all turned off, and the third switch 580 is turned on. In the DDR mode, a pull-up and pull-down current flows to the data input/output pad 520 via the first resistor 550 and the second resistor 570. At this time, the pull-up and pull-down current that flows through the first resistor 550 and the second resistor 570 can be adequately adjusted to satisfy the standard output low current (IOL) that the system user intends to obtain.

When the SDR mode is selected, the first switch 540, the second switch 560 and the third switch 580 are all turned on, while the fourth switch 590 is turned off. Accordingly, the first resistor (R1) 550 and the second resistor 570 get negated in a circuit of the data output driver.

In short, even though the data output driver of the combination type of the SDRAM device is identical in the DDR mode and the SDR mode, the pull-up and pull-down current is adequately adjusted by getting the first resistor 550 and the second resistor 570 involved only with the DDR mode not the SDR mode. Consequently, the data output driver in accordance with the second embodiment of the present invention can satisfy the input/output buffer information specification (IBIS) standard applicable both to the DDR mode and the SDR mode.

The block diagram of the data output driver in accordance with the first embodiment of the present invention shown in FIG. 3 presents an ideal circuit configuration of the data output driver. However, the circuit configuration of the data output driver in accordance with the second embodiment of the present invention shown in FIG. 5 is needed in reality because it is necessarily required to design data output driver, the data strobe output driver and a data mask output driver to have an identical configuration.

In more detail of the data strobe output driver, the data output driver and the data mask output driver, the data strobe output driver should not be operated in the SDR mode. Therefore, it is required to connect the data strobe input/output pad with the ground voltage and to form such third switch 580 and fourth switch 590 as shown in FIG. 5.

Describing the data mask output driver, the data mask output driver is not used during a write operation of the DDR mode. Accordingly, such third switch 580 and the fourth switch 590 as shown in FIG. 5 are required. Furthermore, such second switch 560 and the second resistor 570 as shown in FIG. 5 are also required in consideration of a capacity property of a data mask pin which is connected with a data mask input pad.

Consequently, the circuit configuration of the data output driver illustrated in FIG. 5 is identical to circuit configurations of the data strobe output driver and the data mask output driver, and the first switch 540, the second switch 560, the third switch 580 and the fourth switch 590 shown in FIG. 5 are selectively turned on or turn off.

Turn-on/turn-off conditions of the switches illustrated in FIGS. 3 to 5 are decided by locally forming or not forming a first conductive layer. In addition, the resistors having a contact resistance or a sheet resistance of a second conductive layer are formed by forming a path electrically connecting the first conductive layer with the second conductive layer.

Figure 6:
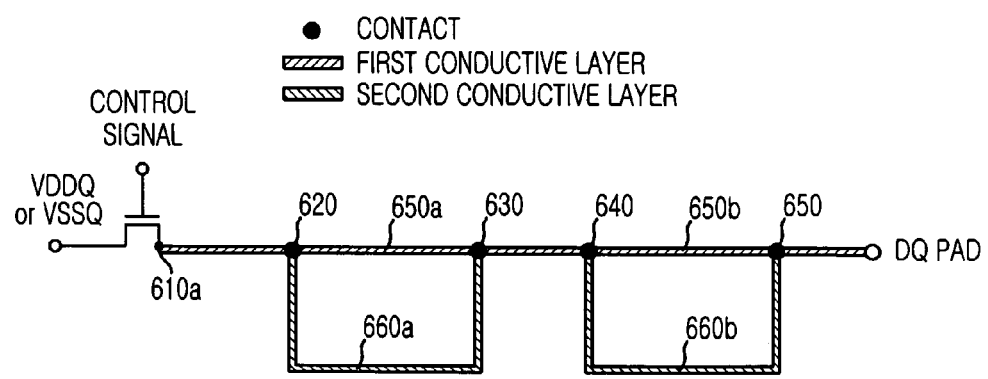
FIG. 6 is a diagram embodying a switch and a resistor each formed with a conductive layer.
Figure 7:
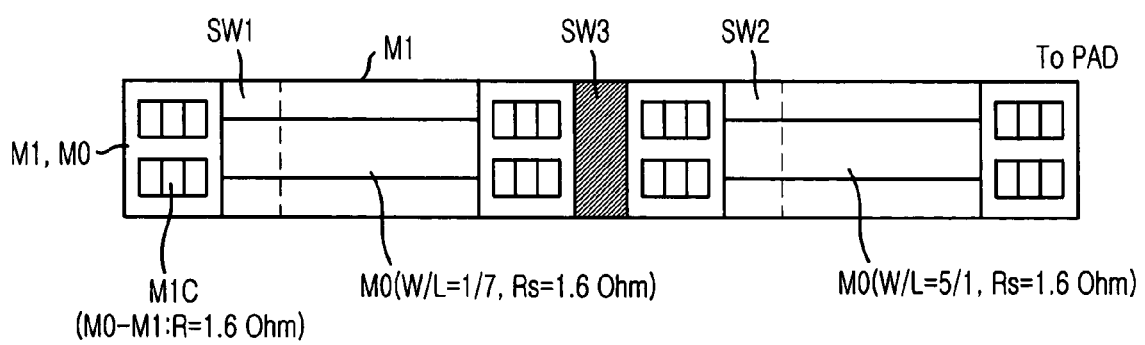
FIG. 7 is a top view showing the conductive layers in the FIG. 6.

The above relationship between the turn-on/turn-off state of the switches and resistors and the conductive layers will be described in more detail referring to FIGS. 6 and 7. FIG. 6 is a diagram exemplifying the switches and resistors each formed with the first or the second conductive layer. FIG. 7 is a diagram showing a top view of the first and the second conductive layers shown in FIG. 6.

As shown in FIG. 6, a drain terminal 610A of a pull-up and pull-down transistor is connected with a data pad (DQ PAD) through the first conductive layer. Also, a plurality of contact nodes 620, 630, 640 and 650 are formed by connecting the first conductive layer with the second conductive layer. Each of the above contact nodes 620, 630, 640 and 650 will be referred as a first contact node, a second contact part, a third contact node, and a fourth contact node, respectively.

Referring to FIGS. 5 and 6, portions of the first conductive layer 650A and 650B are opened if it is needed to turn off the first switch 540 and the second switch 560. Thereafter, the resistance values of the first resistor 550 and the second resistor 570 are decided by the contact resistance values of the first, second, third and fourth contact nodes 620, 630, 640 and 650 and the sheet resistance values of portions of the second conductive layers 660A and 660B.

Referring to FIG. 7, the first conductive layer and the second conductive layer are denoted with reference marks 'M1' and 'M0', respectively. Also, another reference mark 'M1C' denotes a contact between the first conductive layer and the second conductive layer.

Figure 8:
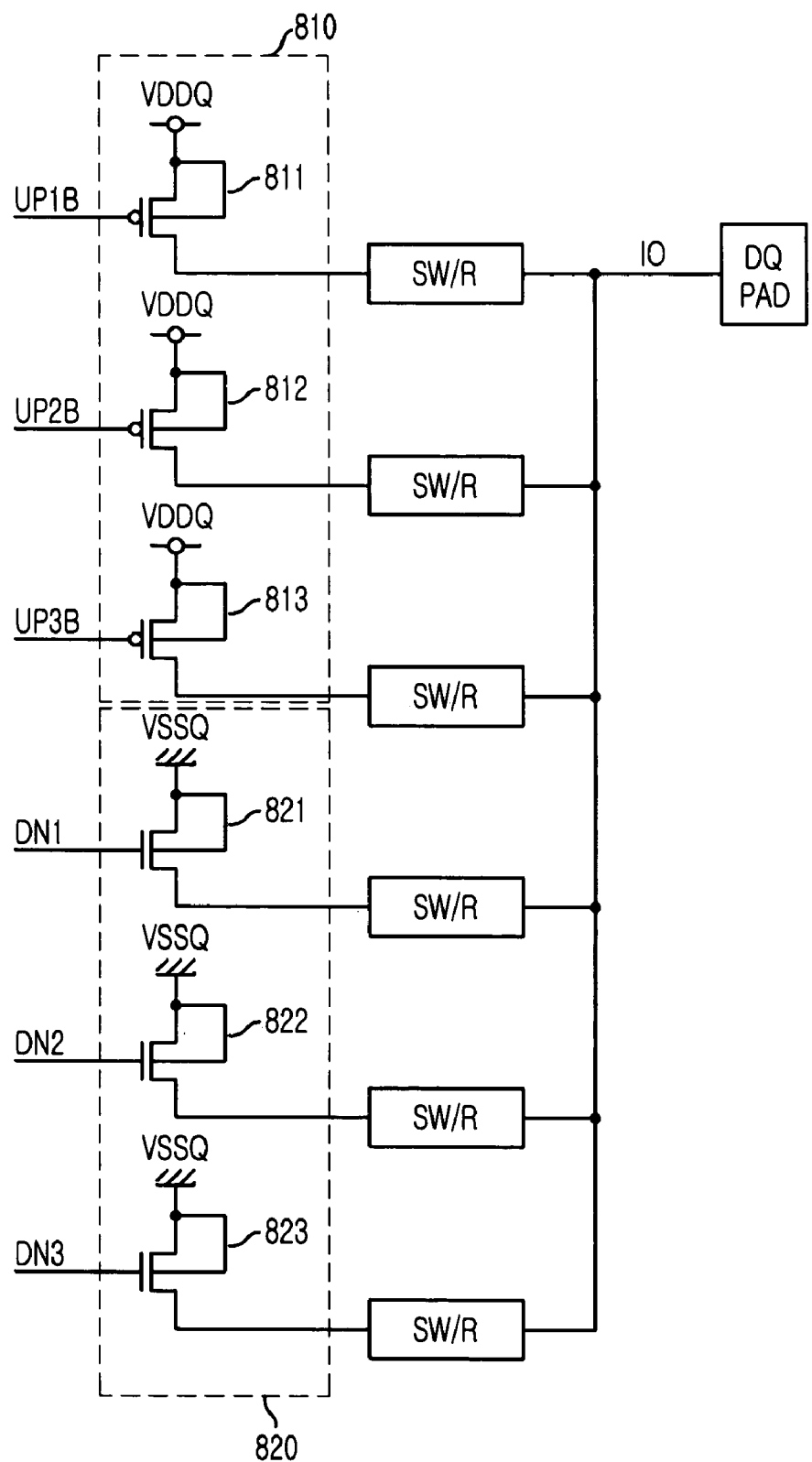
FIG. 8 is a diagram illustrating a circuit configuration of a data output driver controlled by an expansion mode resistor set (EMRS) in accordance with the present invention.

Referring to FIGS. 5, 7 and 8, if each contact part is constituted with six contacts and the second conductive layer is formed to have a ratio of width (W) to length (L) in about 1:7, and if a pull-up and pull-down driver block is constituted with thirteen pull-up and pull-down transistors, a total maximum resistance value of the first resistor 550 and the second resistor 570 becomes about 2.29 Ω in reality.

FIG. 8 is a diagram showing a data output driver controlled by an extended mode register set (EMRS). As shown, a plurality of a switch and resistor couple are formed at each respective output path of a first to a third pull-up drivers 811, 812 and 813 and a first to a third pull-down drivers 821, 822 and 823.

More specifically, output terminals of the first to the third pull-up drivers 811, 812 and 813 and the first to the third pull-down drivers 821, 822 and 823 are connected with a data pad (DQ PAD) in common. Also, data corresponding to supply voltages (VDDQs and VSSQs) generated by a first to a third pull-up control signals UP1B, UP2B and UP3B and a first to a third pull-down control signals DN1, DN2 and DN3 are outputted to the data pad (DQ PAD) through an input/output (IO) line. At this time, each switch and resistor couple is parallel-connected to each other. Also, the switches connected with the first to the third pull-down drivers 821 to 823 of a pull-down driver block 820 become open in the DDR mode, so that a pull-down current is reduced by the resistors (R).

A pull-up driver block 810 in FIG. 8 is constituted with three pull-up drivers 811, 812 and 813 even though more or less than the three pull-up drivers 810 may be formed in the pull-up driver block 810. Herein, the three pull-up drivers 811, 812 and 813 are referred as a fist pull-up driver, a second pull-up driver and a third pull-up driver, respectively. Also, the first to the third pull-up drivers 811, 812 and 813 are operated by a first to a third pull-up control signals UP1B, UP2B and UP3B generated from the extended mode resistor set (EMRS). At this time, activation of the first to the third pull-up control signals UP1B, UP2B and UP3B is decided by a selection of a full strength operation or a half strength operation. In the full strength operation, all of the first to the third pull-up control signals UP1B, UP2B and UP3B become active and all of the first to the third pull-up drivers 811, 812 and 813 become enabled, and thereby allowing a maximum pull-up current to flow.

For the sake of convenience, each of the pull-up drivers and the pull-down drivers is denoted with one representative PMOS transistor or one representative NMOS transistor even though each pull-up driver or pull-down driver can include plural numbers of PMOS or NMOS transistors. Also, each of the first to the third pull-up drivers 811 to 813 may constitute with the same or different numbers of the PMOS or NMOS transistors.

Figure 9A:
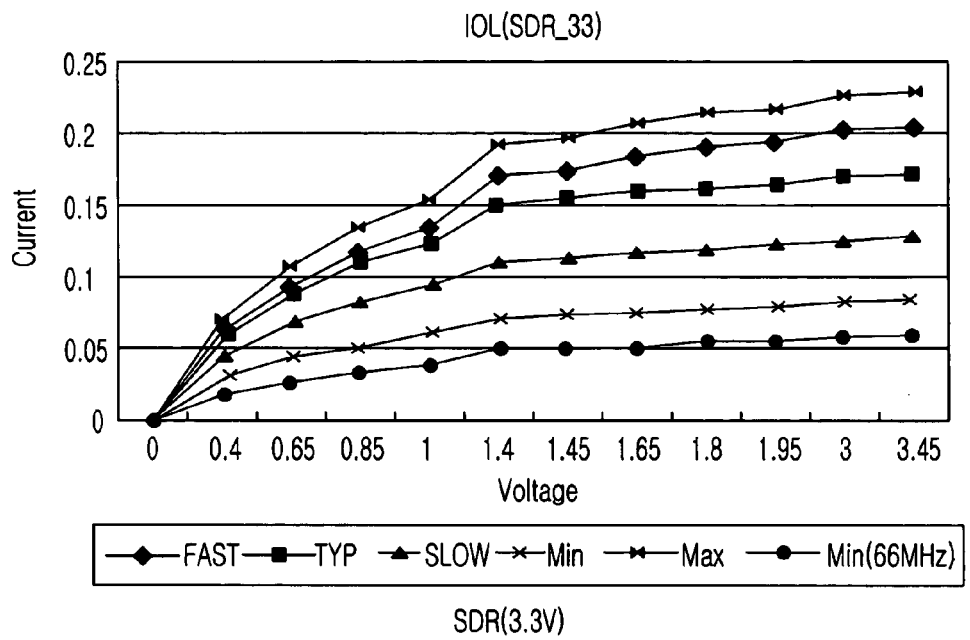
FIGS. 9A to 9B are graphs illustrating IOL simulation results for a current/voltage property in a single data rate mode or a double data rate mode of a data output driver having a combination type of a SDRAM device in accordance with the present invention.
Figure 9B:
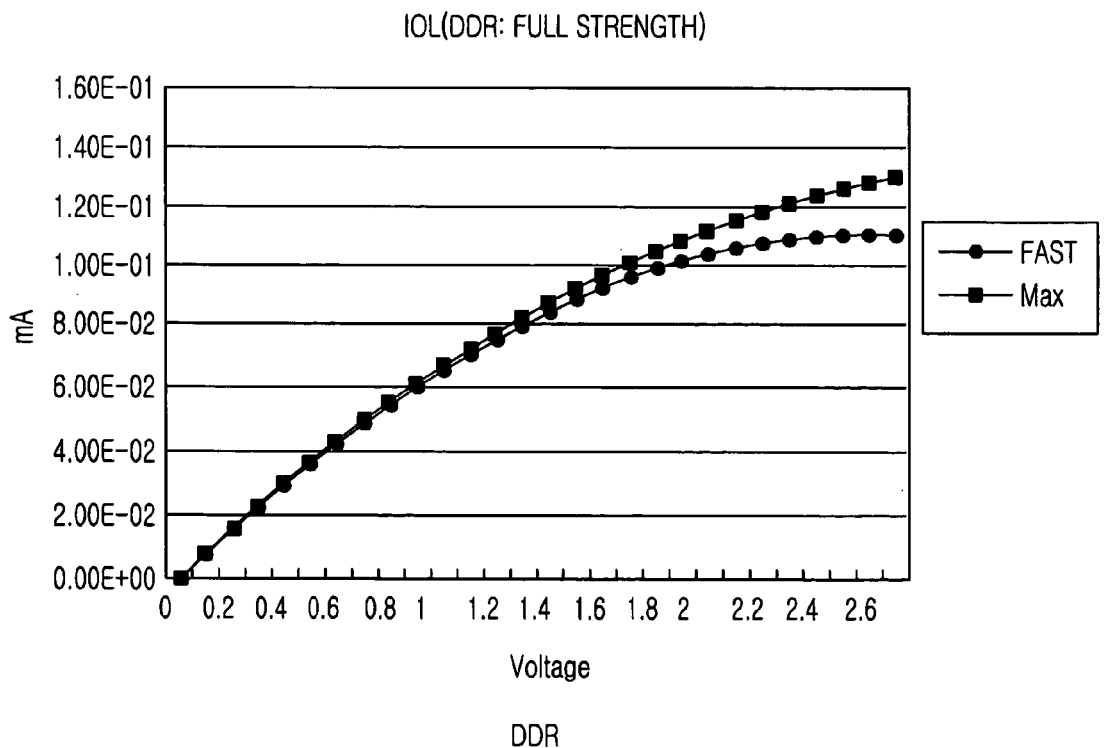

FIGS. 9A and 9B are graphs showing simulation results obtained by the data output driver illustrated in FIG. 7. FIG. 9A shows features of the output low current (IOL) obtained in conditions of slow, typical and fast speed of operations. Herein, the output low current (IOL) in each condition satisfies both of the required maximum and minimum IBIS values. FIG. 9B shows features of the output low current (IOL) obtained in the DDR mode. Herein, the output low current (IOL) satisfies the IBIS standard even in the linear region obtained in condition of the fast speed of operation.

On the basis of the preferred embodiments of the present invention, the combination type of the SDRAM device compatible with both of the SDR mode and the DDR mode can be suitably operable under the IBIS standards by correspondently adjusting the output voltage/current to be selectively applicable in the SDR mode or in the DDR mode. Particularly, the correspondent adjustment of the output voltage/current can be obtained by performing the mask option-selection process carried to the first conductive layer.

While the present invention has been shown and described with respect to the particular embodiments, it will be apparent to those skilled in the art that many changes and modification may be made without departing from the spirit and scope of the invention as defined in the appended claims.

What is claimed is:

1. A data output driver of a combination type of a synchronous dynamic random access memory (SDRAM) device operated in both of a single data rate (SDR) mode and a double data rate (DDR) mode, the data output driver comprising:
   a first input/output line connected between a drain of a pull-up transistor and a data input/output pad;
   a second input/output line connected between a drain of a pull-down transistor and the data input/output pad;
   at least one switching unit formed on each of the first input/output line and the second input/output line; and
   at least one resistor parallel-connected with the switch and formed on each of the first input/output line and the second input/output line, wherein the switching unit is turned on or turned off by selecting one of a SDR mode and a DDR mode.

2. The data output driver as recited in claim 1, wherein the first and second input/output lines are a first conductive layer and the resistor includes a second conductive layer contacted with the first conductive layer.

3. The data output driver as recited in claim 2, wherein the switching unit is turned off between a first node and a second node formed on the first conductive layer regardless of the second conductive layer, wherein the first conductive layer is contact with the second conductive layer at the first node and the second node.

4. The data output driver as recited in claim 3, wherein, in the selected DDR mode, the drain of the pull-down transistor is connected with the data strobe input/output pad through the resistor by turning off the switching unit formed on the second output line.

5. The data output driver as recited in claim 2, wherein a resistance value of the resistor is determined by the number of contact nodes formed between the first conductive layer and the second conductive layer.

6. The data output driver as recited in claim 2, wherein the resistance value of the resistor is determined by a ratio of width to length of the second conductive layer.

7. A data strobe output driver of a combination type of a synchronous dynamic random access (SDRAM) device operated in both of a single data rate (SDR) mode and a double data rate (DDR) mode, the data strobe output driver comprising:
   a first input/output line connected between a drain of a pull-up transistor and a data strobe input/output pad;
   a second input/output line connected between a drain of a pull-down transistor and the data strobe input/output pad;
   a first switch formed on each of the first input/output line and the second input/output line;
   a resistor parallel-connected with the first switch and formed on each of the first input/output line and the second input/output line;
   a second switch formed on the first input/output line and the second input/output line between the data strobe output pad and an output terminal of the first switch; and
   a third switch formed between an output of the second switch and a ground voltage, wherein the first to the third switches are turned on or turned off by selecting one of the SDR mode and the DDR mode.

8. The data strobe output driver as recited in claim 7, wherein the first and second input/output lines are a first conductive layer and the resistor includes a second conductive layer contacted with the first conductive layer.

9. The data strobe output driver as recited in claim 8, wherein the first switch is turned off between a first node and a second node formed on the first conductive layer regardless of the second conductive layer, wherein the first conductive layer is contact with the second conductive layer at the first node and the second node.

10. The data strobe output driver as recited in claim 9, wherein, in the selected DDR mode, the drain of the pull-down transistor is connected with the data strobe input/output pad through the resistor by turning off the first switch formed on the second output line.

11. The data strobe output driver as recited in claim 7, wherein, in the SDR mode, the second switch is turned off and the third switch is turned on, so that a floating state of the first and second input/output lines at the output of the second switch is blocked.

12. The data strobe output driver as recited in claim 8, wherein the second switch and the third switch are turned off by not forming the first conductive layer locally.

13. The data strobe output driver as recited in claim 8, wherein a resistance value of the resistor is decided by the number of the contact nodes formed between the first conductive layer and the second conductive layer.

14. The data strobe output driver as recited in claim 8, wherein the resistance value of the resistor is decided by a ratio of width to length of the second conductive layer.

15. A synchronous dynamic random access memory (SDRAM) of a combination type applying a singe data rate (SDR) mode and a double data rate (DDR) mode having a data output driver, a data strobe output driver and a data mask driver, each the data output driver, the data strobe output driver and the data mask driver comprising:
- a first input/output line connected with a drain of a pull-up transistor and an input/output pad;
- a second input/output line connected with a drain of a pull-down transistor and the input/output pad;
- a first switching unit connected with each of the first input/output line and the second input/output line at the drains of the pull-up transistor and the pull-down transistor;
- a first resistor parallel-connected with the first switch formed on each of the first input/output line and the second input/output line;
- a second switch formed on each of the first input/output line and the second input/output line adjacent to the input/output pad;
- a second resistor parallel-connected with the second switch and formed on each of the first input/output line and the second input/output line; and
- a third switch formed on each of the first input/output line and the second input/output line allocated between the first switch and the second switch, wherein the first to the third switches are turned on or off by selecting one of the SDR mode and the DDR mode.

16. The SDRAM as recited in claim 15, wherein the data strobe output driver further comprises a fourth switch formed between the first and the second input/output lines and a ground voltage.

17. The SDRAM as recited in claim 16, wherein each of the first input/output line and the second input/output line is a first conductive layer, and the first resistor and the second resistor are a second conductive layer contacted with the first conductive layer.

18. The SDRAM as recited in claim 17, wherein the first and second switches are turned off between a first node and a second node formed on the first conductive layer regardless of the second conductive layer, wherein the first conductive layer is contact with the second conductive layer at the first node and the second node.

19. The SDRAM as recited in claim 18, wherein, in the selected DDR mode, the drain of the pull-down transistor is connected with the data strobe input/output pad through the first and second resistors by turning off the switching unit formed on the second output line.

20. The SDRAM as recited in claim 16, wherein a floating state of the first input/output line and the second input/output line adjacent to an output terminal of the second switch is blocked by turning off the third switch in the SDR mode and turning on the fourth switch in the DDR mode.

21. The SDRAM as recited in claim 16, wherein each of the first input/output line and the second input/output line is formed with the first conductive layer, and the second to the fourth switches are turned off by not forming the first conductive layer locally.

22. The SDRAM as recited in claim 17, wherein a resistance value of the resistor is decided by the number of the contact nodes formed between the first conductive layer and the second conductive layer.

23. The SDRAM as recited in claim 17, wherein the resistance value of the resistor is decided by a ratio of width to length of the second conductive layer.

* * * * *